United States Patent
Brech et al.

(10) Patent No.: US 9,997,443 B2
(45) Date of Patent: Jun. 12, 2018

(54) THROUGH VIAS AND METHODS OF FORMATION THEREOF

(71) Applicant: Infineon Technologies AG, Neubiberg (DE)

(72) Inventors: Helmut Brech, Lappersdorf (DE); Albert Birner, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 495 days.

(21) Appl. No.: 13/776,153

(22) Filed: Feb. 25, 2013

(65) Prior Publication Data

US 2014/0239411 A1    Aug. 28, 2014

(51) Int. Cl.

| | | |
|---|---|---|
| *H01L 29/73* | (2006.01) | |
| *H01L 29/08* | (2006.01) | |
| *H01L 29/417* | (2006.01) | |
| *H01L 23/48* | (2006.01) | |
| *H01L 21/8234* | (2006.01) | |
| *H01L 27/12* | (2006.01) | |
| *H01L 23/498* | (2006.01) | |
| *H01L 21/768* | (2006.01) | |

(52) U.S. Cl.
CPC .. *H01L 23/49827* (2013.01); *H01L 21/76898* (2013.01); *H01L 23/481* (2013.01); *H01L 29/0804* (2013.01); *H01L 29/0821* (2013.01); *H01L 29/41758* (2013.01); *H01L 29/41766* (2013.01); *H01L 29/73* (2013.01); *H01L 21/823431* (2013.01); *H01L 27/1211* (2013.01); *H01L 2924/0002* (2013.01)

(58) Field of Classification Search
CPC ....... H01L 21/76898; H01L 21/823431; H01L 23/49827; H01L 23/481; H01L 29/41758; H01L 29/41766; H01L 29/73; H01L 29/0804; H01L 29/0821
USPC .................. 257/394, 565; 438/667
See application file for complete search history.

(56) References Cited

U.S. PATENT DOCUMENTS

| | | | |
|---|---|---|---|
| 6,048,772 A | 4/2000 | D'Anna | |
| 6,633,075 B1* | 10/2003 | Shirakawa ............ | H01L 23/367 257/565 |
| 7,052,937 B2* | 5/2006 | Clevenger ......... | H01L 21/76264 257/717 |
| 7,098,070 B2* | 8/2006 | Chen ................. | H01L 21/76898 257/738 |
| 7,111,149 B2* | 9/2006 | Eilert ....................... | G11C 5/02 365/230.01 |
| 7,119,399 B2* | 10/2006 | Ma ........................ | H01L 23/481 257/341 |
| 7,338,896 B2* | 3/2008 | Vanhaelemeersch . | H01L 21/762 257/E21.597 |
| 7,402,515 B2* | 7/2008 | Arana ............... | H01L 21/76898 257/774 |
| 7,449,762 B1* | 11/2008 | Singh ........................... | 257/493 |

(Continued)

FOREIGN PATENT DOCUMENTS

| | | |
|---|---|---|
| CN | 1708859 A | 12/2005 |
| CN | 101558483 A | 10/2009 |

*Primary Examiner* — Mohsen Ahmadi
(74) *Attorney, Agent, or Firm* — Slater Matsil, LLP

(57) ABSTRACT

In accordance with an embodiment of the present invention, a semiconductor chip includes a device region disposed in or over a substrate, a doped region disposed in the device region, and a through via disposed in the substrate. The through via extends through the doped region.

42 Claims, 17 Drawing Sheets

(56) References Cited

U.S. PATENT DOCUMENTS

| | | | |
|---|---|---|---|
| 7,518,169 B2 | 4/2009 | Taddiken | |
| 7,939,914 B2 * | 5/2011 | Bernstein et al. | 257/621 |
| 8,198,719 B2 | 6/2012 | Kim | |
| 8,263,434 B2 | 9/2012 | Pagaila et al. | |
| 8,304,891 B2 | 11/2012 | Chiang et al. | |
| 2001/0029079 A1 * | 10/2001 | Yokoyama | H01L 21/76802 438/309 |
| 2002/0020862 A1 | 2/2002 | Livengood et al. | |
| 2004/0056284 A1 * | 3/2004 | Nagaoka et al. | 257/253 |
| 2005/0145938 A1 * | 7/2005 | Lin | 257/347 |
| 2006/0071242 A1 * | 4/2006 | Frisina et al. | 257/220 |
| 2007/0037379 A1 * | 2/2007 | Enquist | H01L 21/76898 438/618 |
| 2008/0203378 A1 * | 8/2008 | Tanaka et al. | 257/5 |
| 2009/0184352 A1 | 7/2009 | Yamaguchi et al. | |
| 2010/0032764 A1 | 2/2010 | Andry et al. | |
| 2012/0267786 A1 | 10/2012 | Kirby et al. | |
| 2012/0305917 A1 | 12/2012 | Yoko et al. | |
| 2012/0326329 A1 | 12/2012 | Tay et al. | |
| 2012/0331435 A1 | 12/2012 | Rahman | |
| 2013/0001676 A1 | 1/2013 | Bartley et al. | |
| 2013/0011985 A1 * | 1/2013 | Ratnam | H01L 29/0634 438/286 |

* cited by examiner

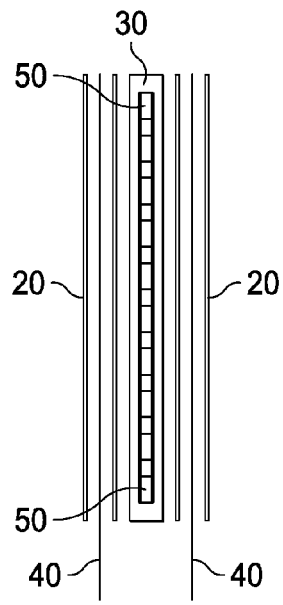 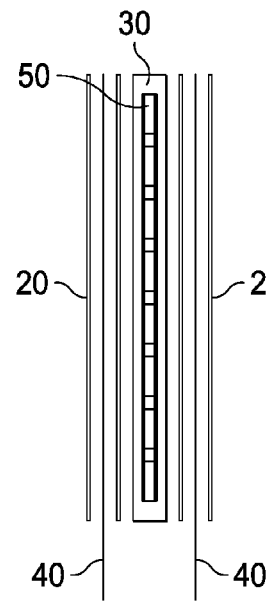 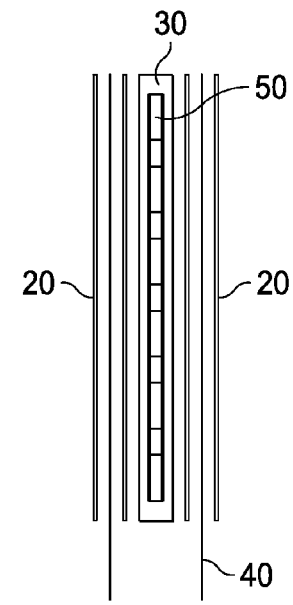
FIG. 10A  FIG. 10B  FIG. 10C
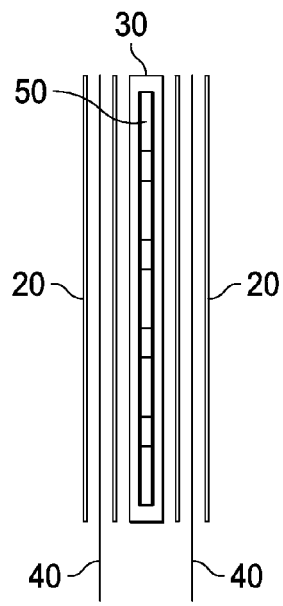 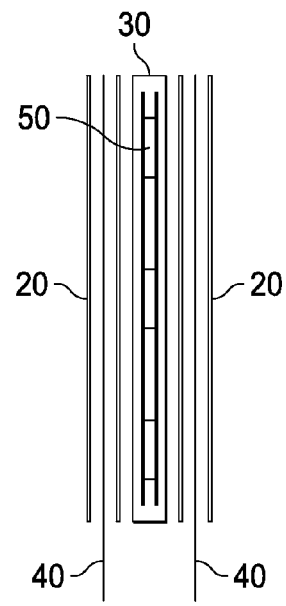 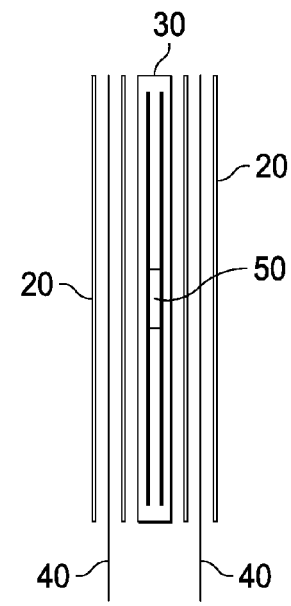
FIG. 10D  FIG. 10E  FIG. 10F

US 9,997,443 B2

1

THROUGH VIAS AND METHODS OF FORMATION THEREOF

TECHNICAL FIELD

The present invention relates generally to semiconductor devices, and more particularly to through vias and methods of formation thereof.

BACKGROUND

Semiconductor devices are used in a variety of electronic applications, such as personal computers, cell phones, digital cameras, power conversion and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is used frequently in semiconductor devices. There may be millions of transistors on a single integrated circuit (IC), or only a single transistor with a large gate periphery to conduct large currents, for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

Metallization layers are formed over the transistors. The metallization layers include interconnects for interconnecting the transistors and also to contact pads for contacting the transistors with external circuitry. The circuitry used to contact the transistors can introduce significant parasitic effects, which can degrade the performance of the transistors.

SUMMARY OF THE INVENTION

In accordance with an embodiment of the present invention, a semiconductor chip comprises a device region disposed in or over a substrate, a doped region disposed in the device region, and a through via disposed in the substrate and extending through the doped region.

In accordance with another embodiment of the present invention, a semiconductor device comprises a doped region disposed in an active region of a substrate, and a plurality of through vias disposed in the substrate. The plurality of through vias extends through the doped region.

In accordance with another embodiment of the present invention, a semiconductor device comprises a source/drain region disposed in an active region of a substrate, and a through via disposed in the substrate. The through via extends through the source/drain region.

In accordance with another embodiment of the present invention, a semiconductor device comprises a first transistor disposed in a substrate and comprising a first source/drain and a second transistor disposed in the substrate and comprising a second source/drain. The first source/drain and the second source/drain share a common region. A first through via is disposed in the common region.

In accordance with another embodiment of the present invention, a method of forming a semiconductor chip comprises forming a device region in or over a substrate,

2 forming a doped region in the device region, and forming a through via in the substrate. The through via extends through the doped region.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2A and 2B, illustrates a semiconductor device comprising through vias in device regions in accordance with embodiments of the present invention, wherein FIG. 2A illustrates a top view and FIG. 2B illustrates a cross-sectional view;

FIG. 3, which includes FIGS. 3A and 3B, illustrates a semiconductor device comprising through vias coupled to a top conductive layer in accordance with an alternative embodiment of the present invention, wherein FIG. 3A illustrates a top view and FIG. 3B illustrates a cross-sectional view of a semiconductor device;

FIG. 4, which includes

FIG. 5, which includes FIGS. 5A-5D, illustrates a semiconductor device in accordance with an alternative embodiment of the present invention in which the through openings are partially filled, wherein FIG. 5A illustrates a top view and FIGS. 5B-5D illustrate cross-sectional views of the semiconductor device;

FIG. 7, which includes FIGS. 7A-7C, illustrates alternative embodiments of a semiconductor device having laterally offset through vias, wherein FIG. 7A illustrates a top view, and FIGS. 7B and 7C illustrate magnified alternative top views;

FIG. 8, which includes FIGS. 8A and 8B, illustrates an alternative embodiment of a semiconductor device having a top metallization layer integrated with a through via, wherein FIG. 8A illustrates a top view while FIG. 8B illustrates a cross-sectional view;

FIG. 9, which includes

FIG. 10, which includes FIGS. 10A-10F, illustrates top views of a semiconductor device having a plurality of through vias integrated with a top conductive layer and having different aspect ratios in accordance with alternative embodiments of the present invention;

FIG. 11, which includes

FIG. 13, which includes

FIG. 15, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
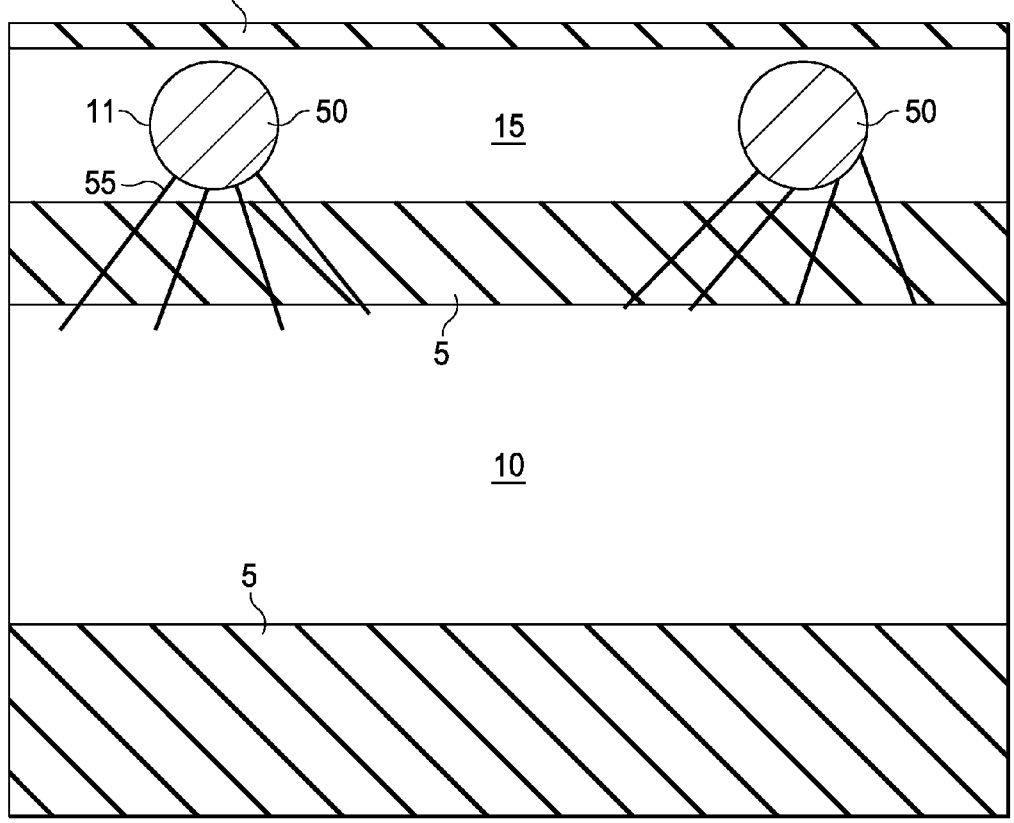
FIG. 1 illustrates a semiconductor device comprising a conventional through via formed in isolated regions.

FIG. 1 illustrates a semiconductor device comprising a conventional through via.

Through vias are used in many semiconductor device applications to reduce the parasitic effects such as inductances, capacitances that are other introduced, for example, by bonding wires. Many semiconductor devices such as power semiconductor devices may comprise a finger transistor having a plurality of fingers to increase the amount of current without building long structures.

Referring to FIG. 1, in a conventional semiconductor device, multiple device regions are coupled to common bond pads 11. The multiple device regions are coupled to the bond pads 11 by interconnects 55. Next, the bond pads 11 are coupled to the back side of the substrate 10 (e.g., to the package pins) by through vias 50.

Thus, the through vias 50 are placed in a through via region 15 that is physically separate from the device regions of the substrate 10. The through via region 15 may be isolated from the device region by isolation regions 5, e.g., trench isolation layers.

The use of through via 50 is intended to eliminate the total parasitics between the device regions and the package pins. However, the inventors of the present invention have identified that these interconnects 55 may introduce significant parasitic effects themselves thereby reducing the benefits associated with the formation of through vias 50.

Embodiments of the present invention minimize parasitic effects significantly by eliminating the parasitic effects associated with the interconnects 55. A structural embodiment of the invention will be described using FIG. 2. Further alternative structure embodiments will be described using FIGS. 3, and 5-14. Embodiments of methods of fabricating the semiconductor device will be described using FIG. 4.

Figure 2A:
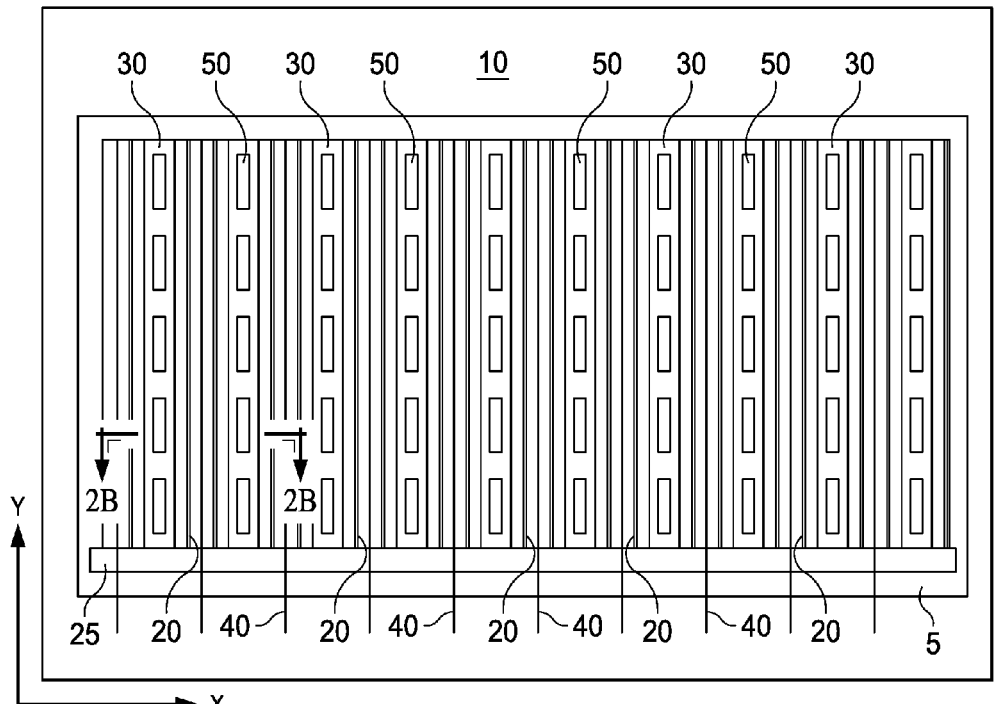
Figure 2B:
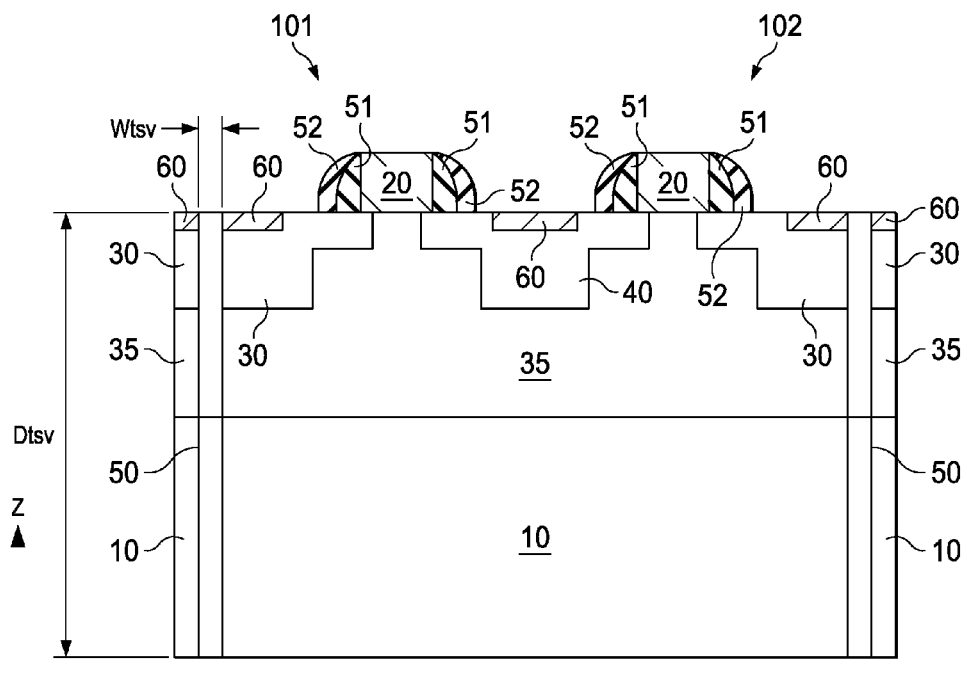

FIG. 2, which includes FIGS. 2A and 2B, illustrates a semiconductor device in accordance with embodiments of the present invention. FIG. 2A illustrates a top view and FIG. 2B illustrates a cross-sectional view.

FIG. 2A illustrates one embodiment of a semiconductor device comprising a finger field effect transistor. The finger field effect transistor may be a n-channel metal insulator field transistor in one embodiment. In another embodiment, the finger field effect transistor may be a p-channel metal insulator field effect transistor. In one embodiment, the finger field effect transistor comprises a planar transistor, while in another embodiment the finger field effect transistor comprises a multi-gate transistor such as a fin field effect transistor (FINFET).

Referring to FIG. 2A, the finger field effect transistor comprises a plurality of source regions 30. A plurality of drain regions 40 are arranged between each adjacent one of the plurality of source regions 30. In one embodiment, the plurality of source regions 30 and the plurality of drain regions 40 are disposed in a well region 35 within the substrate 10 (FIG. 2B). In some embodiments, the plurality of source regions 30 and the plurality of drain regions 40 may be partially or completely formed above the substrate 10 and may also include raised source/drain regions. In various embodiments, the net doping of the plurality of source regions 30 and the plurality of drain regions 40 is opposite the net doping of the well region 35.

Further, a gate line of a plurality of gate lines 20 is disposed over the substrate 10. A gate line of the plurality of gate lines 20 is arranged between a source region of the plurality of source regions 30 and a drain region of the plurality of drain regions 40.

The plurality of gate lines 20 may be coupled together in one or more embodiments. In one or more embodiments, the plurality of gate lines 20 may be coupled using another conductive line 25 disposed in a same metal level as the plurality of gate lines. In one or more embodiments, the plurality of gate lines 20 is part of a finger structure. In alternative embodiments, the plurality of gate lines 20 may be connected using metallization levels above.

In various embodiments, the substrate 10 may comprise a silicon substrate. The substrate 10 may comprise a bulk silicon substrate or a silicon-on-insulator substrate. In one or more embodiments, the substrate 10 may comprise compound semiconductors such as II VI semiconductors, or III-V semiconductors. In various embodiments, the substrate 10 may comprise SiC, SiGe, GaN, or other semiconductor materials. In one or more alternative embodiments, the substrate 10 may comprise gallium nitride layer over a silicon bulk substrate. In one or more embodiments, the substrate 10 may include epitaxial layers including heteroepitaxial layers. In alternative embodiments, the substrate 10 may comprise silicon carbide layer over silicon. In one or more embodiments, the substrate 10 may comprise any other suitable semiconductor, for example, within which a device such as a transistor or a diode may be fabricated.

Isolation regions 5 are formed in the substrate 10 surrounding the active devices within the substrate 10. The isolation regions 5 may comprise shallow trench isolation (STI) regions, deep trench (DT) isolation regions, field oxide isolation regions, or other insulating regions, as examples.

In various embodiments, the substrate 10 may include a plurality of active devices such as field effect transistors, bipolar transistors, diodes, thyristors, and others. The substrate 10 may also comprise passive devices such as capacitors, inductors, and resistors.

As illustrated in FIG. 2B, a plurality of through vias 50 are disposed in the plurality of source regions 30. In one embodiment, each source region of the plurality of source regions 30 has a row of the plurality of through vias 50. In alternative embodiments, more than one row of the plurality of through vias 50 may be formed within a single source region. Thus, the plurality of through vias 50 may be coupled to each other from the back side of the substrate 10 in one embodiment. Alternatively, the plurality of through vias 50 may be coupled while stacking chips.

FIG. 2B illustrates a magnified cross-sectional view of the semiconductor device in accordance with embodiments of the present invention.

FIG. 2B illustrates two adjacent transistors within the semiconductor device illustrated in FIG. 2A. Referring to FIG. 2B, a first transistor 101 and a second transistor 102 are disposed next to each other. The first transistor 101 and the second transistor 102 include a source region of the plurality of source regions 30 and a drain region of the plurality of drain regions 40. The drain region may be a shared region in one or more embodiments. The plurality of source regions 30 and the plurality of drain regions 40 may be formed within a well region 35. The well region 35 may be a p-type or an n-type well depending on the type of transistor (p-channel or n-channel). In various embodiments, the first transistor 101 and the second transistor 102 may be p-channel or n-channel field effect transistors.

Referring to FIG. 2B, a plurality of gate lines 20 is disposed between the source and the drain regions. Further, each of the first transistor 101 and the second transistor 102 may include one or more spacers such as a first spacer 51 and a second spacer 52.

A contact layer 60 may be disposed over the top surface of the plurality of source regions 30, the plurality of drain regions 40, and optionally over the plurality of gate lines 20. The contact layer 60 may comprise a silicide layer in one or more embodiments. The contact layer 60 may comprise a metal semiconductor compound in one embodiment.

In various embodiments, a plurality of through vias 50 is disposed in the substrate. The plurality of through vias 50 extends through the plurality of source regions 30 and the contact layer 60. The plurality of through vias 50 may be completely or partially filled with a conductive fill material, which may be any suitable conductor. For example, in one or more embodiments, the plurality of through vias 50 may comprise copper, titanium, tungsten, doped polysilicon, and others. The semiconductor device may further include additional metallization layers, which are not illustrated for clarity.

In various embodiments, each of the plurality of through vias 50 comprises a micro-via which may have a large aspect ratio (width Wtsv along the x-axis and a depth Dtsv along the z-axis). In one or more embodiments, the width Wtsv of the plurality of through vias 50 may be about 0.1 μm to about 25 μm, and about 0.1 μm nm to about 5 μm in one embodiment. In one or more embodiments, the ratio of the width Wtsv of the plurality of through vias 50 to the depth Dtsv of the plurality of through vias 50 is about 1:3 to about 1:100, and about 1:5 to about 1:20 in one embodiment.

Figure 3A:
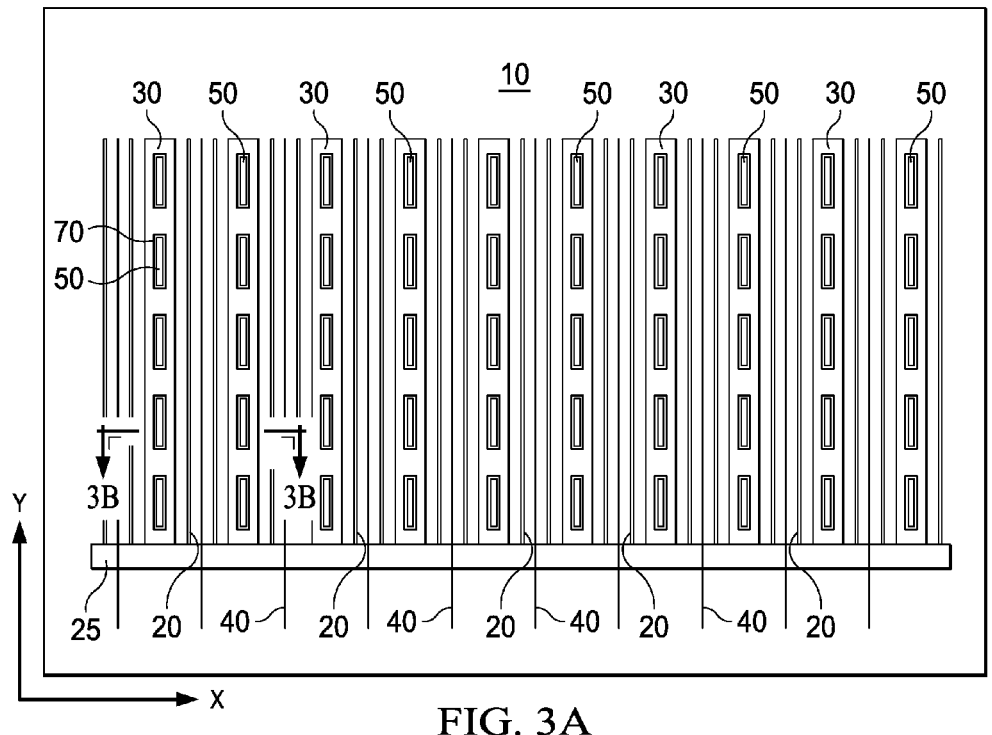
Figure 3B:
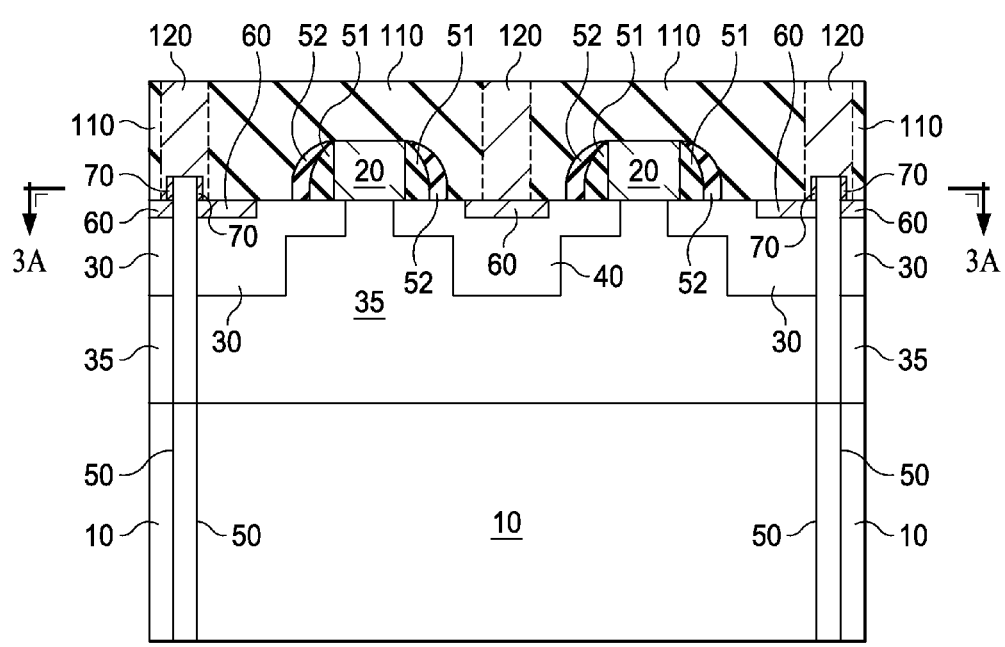

FIG. 3, which includes FIGS. 3A and 3B, illustrates a semiconductor device having a plurality of through vias coupled to a top conductive layer in accordance with an alternative embodiment of the present invention. FIG. 3A illustrates a top view and FIG. 3B illustrates a cross-sectional view of a semiconductor device.

In this embodiment, the plurality of through vias 50 is formed not only within the substrate 10 but also may be formed within layers disposed over the substrate 10. As illustrated in FIG. 3B, a conductive layer 70 is disposed over a portion of each of the plurality of source regions 30. The conductive layer 70 may comprise a metal nitride or a metal silicon nitride in one or more embodiments. In one embodiment, the conductive layer 70 comprises a TiSiN or a TiN layer. In an alternative embodiment, the conductive layer 70 comprises a layer of W, Al, TaN, Ta, or Cu. The plurality of through vias 50 may extend through the conductive layer 70. Thus, the conductive layer 70 is electrically coupled to a through via of the plurality of through vias 50. As illustrated in FIG. 3B, the conductive layer 70 extends over the top surface of the contact layer 60 and thus provides a larger contact area between the through via and the contact layer 60. Thus, the conductive layer 70 may reduce the contact resistance between the contact layer 60 and the through via 50.

Referring to FIG. 3B, an inter level dielectric layer 110 may be disposed over the gate line 20. Contact plugs 120 may be formed within the inter level dielectric layer 110 to couple the regions of the transistors. Thus, the contact plugs 120 may be coupled to the plurality of source regions 30 and the plurality of drain regions 40 through the contact layer 60.

FIG. 4, which includes FIGS. 4A-4D, illustrates a semiconductor device during various stages of fabrication in accordance with embodiments of the present invention.

Figure 4A:
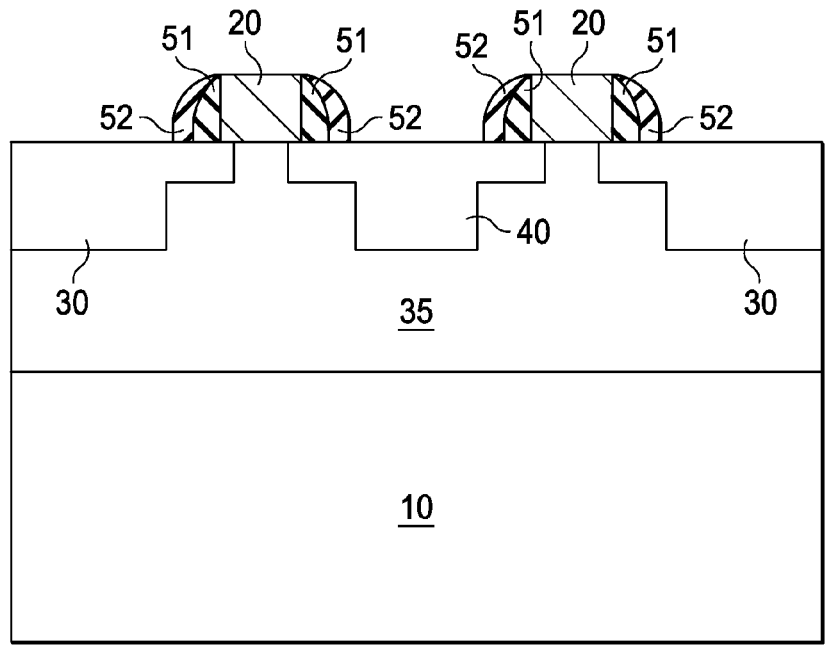
FIGS. 4A-4D, illustrates cross-sectional views of a semiconductor device during various stages of fabrication in accordance with embodiments of the present invention.

Referring to FIG. 4A, a semiconductor device is illustrated after formation of the plurality of gate lines 20, the plurality of source regions 30, and the plurality of drain regions 40. The semiconductor device may also include other regions such as channel regions, which may include halo regions, for example. Further, the plurality of gate lines 20 may be lined with insulating spaces such as the first spacer 51 and the second spacer 52.

Figure 4B:
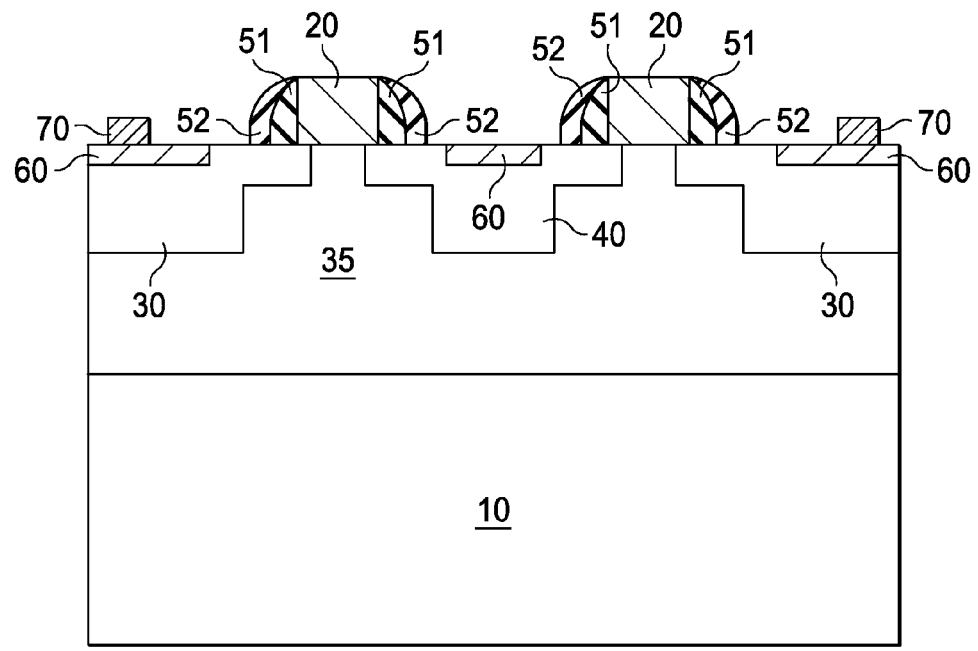

Next, referring to FIG. 4B, a contact layer 60 is formed over the plurality of source regions 30, and the plurality of drain regions 40. The contact layer 60 may be formed over the plurality of gate lines 20. The contact layer 60 may be formed by depositing a contact metal and heating the contact metal so as to form a metallic phase. For example, in one embodiment, the contact layer 60 comprises a metal silicide such as nickel silicide, cobalt silicide, titanium silicide, and others.

After forming the contact layer 60, a conductive material is optionally deposited over the substrate 10. The conductive material may be patterned using conventional lithography techniques to form a conductive layer 70. In one or more embodiments, the conductive layer 70 comprises a metal. In one example the conductive layer 70 is made of copper. In a particular example, the conductive layer 70 is generated using a dual damascene approach, i.e., the fill of the conductive layer 70 and the conductive fill of the through silicon via 150 are formed in one step. In one embodiment, the conductive layer 70 comprises a metal nitride. In one example, the conductive layer 70 comprises titanium nitride passivated with silicon. For example, a titanium nitride layer may be deposited and patterned. After the patterning, the titanium nitride layer may be passivated in a silane atmosphere to form a silicon passivated titanium nitride or TiSiN.

Figure 4C:
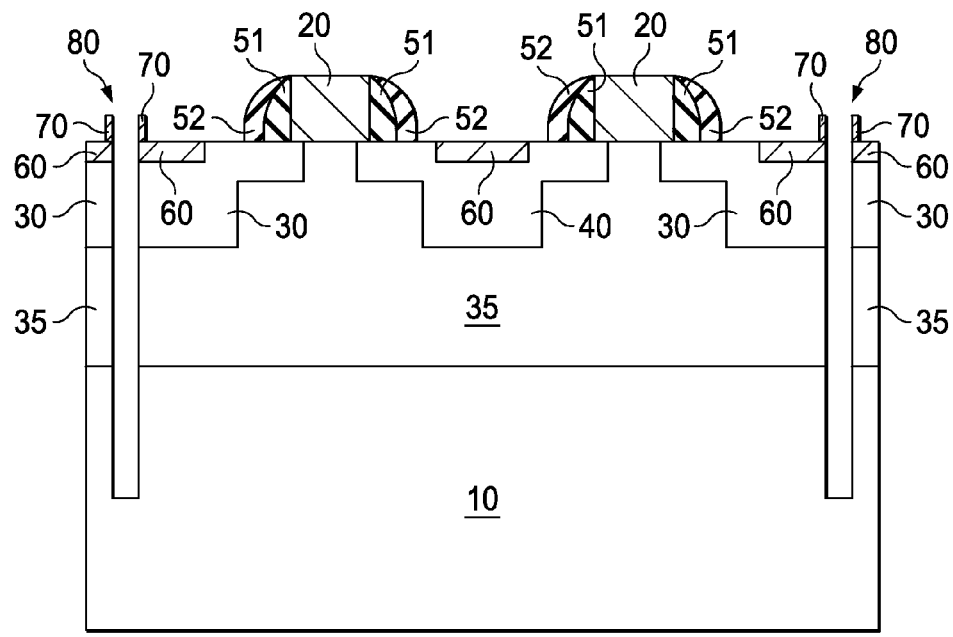

Referring to FIG. 4C, a plurality of openings 80 are formed in the substrate 10. The plurality of openings 80 may be formed through the conductive layer 70 in some embodiments. Intermediate optional anneals may be performed to smooth the edges of the plurality of openings 80 in some embodiments. For example, a hydrogen anneal may be performed in one or more embodiments. In one embodiment the opening 80 comprises an isolation layer.

Figure 4D:
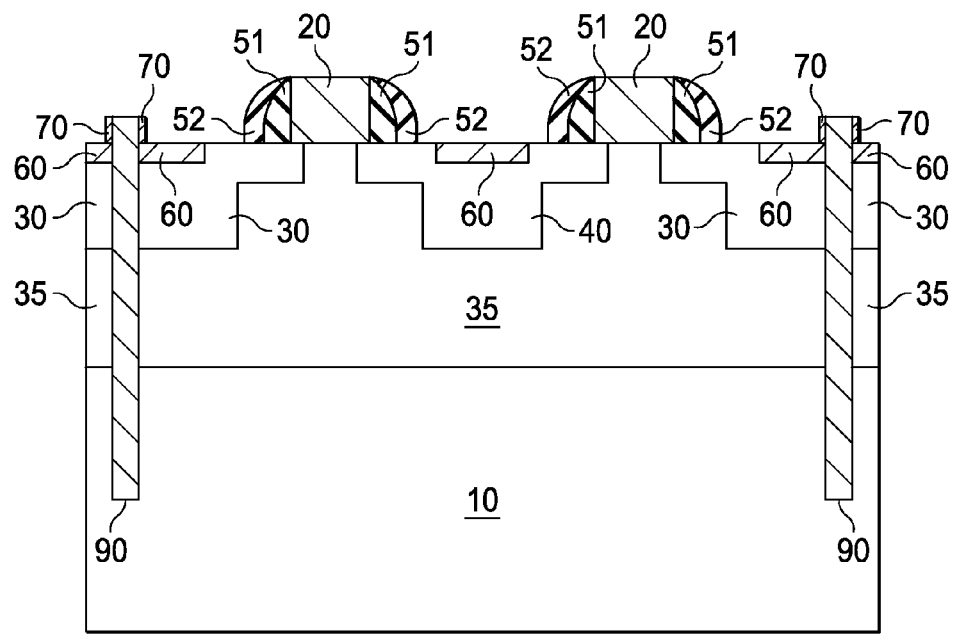

As next illustrated in FIG. 4D, the plurality of openings 80 are filled to form a plurality of vias 90. The substrate 10 may be thinned from the back side to expose a bottom surface of the plurality of vias 90 thereby forming a plurality of through vias as illustrated, for example, in FIG. 3B. Subsequent processing may proceed as in conventional semiconductor processing.

Figure 5A:
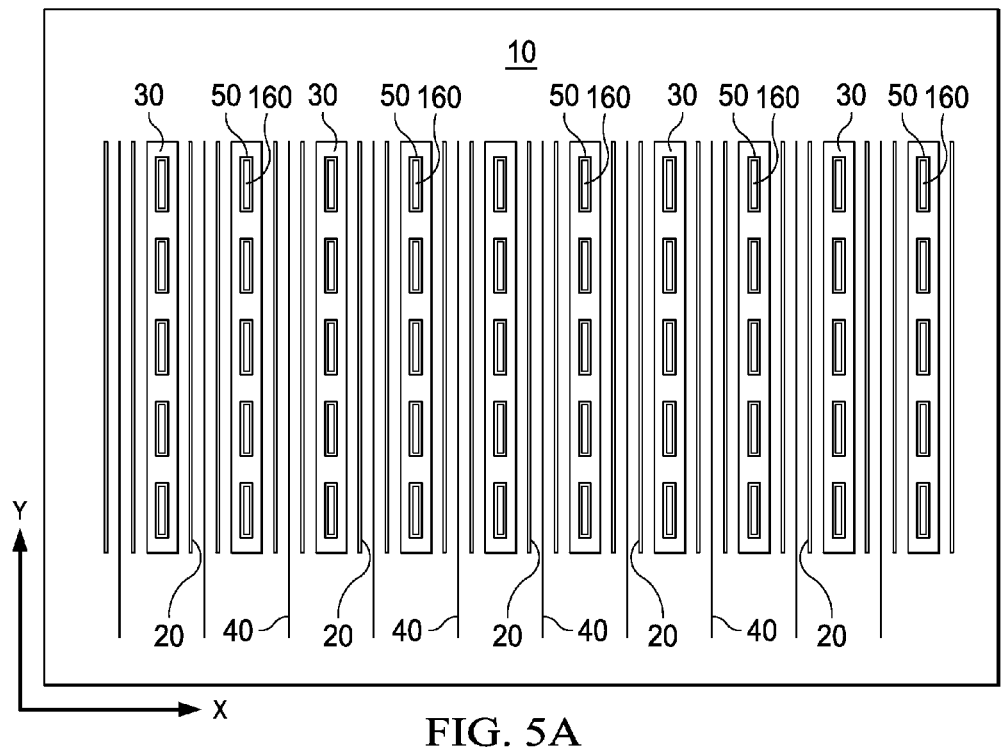
Figure 5B:
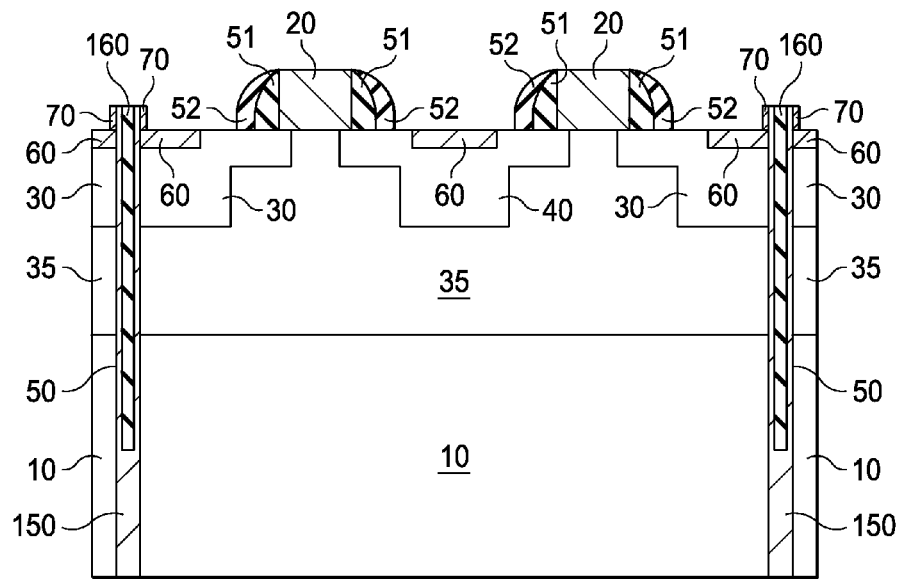
Figure 5C:
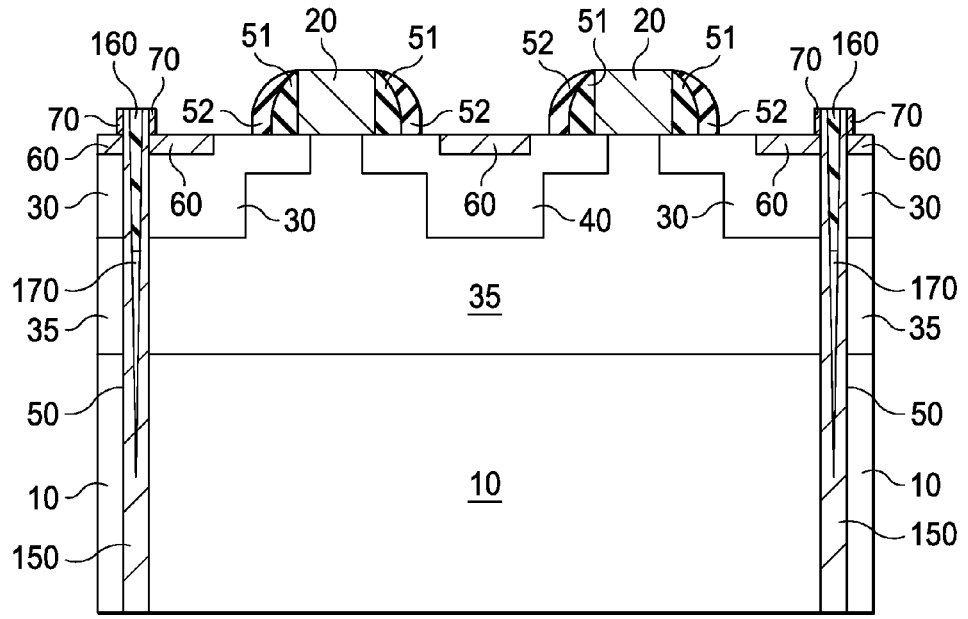
Figure 5D:
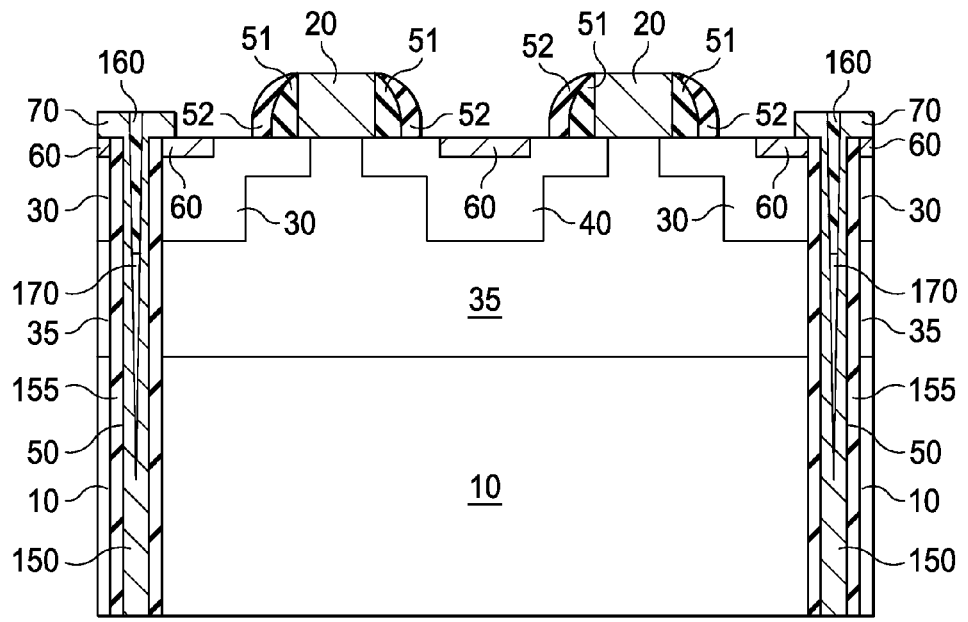

FIG. 5, which includes FIGS. 5A-5D, illustrates a semiconductor device in accordance with an alternative embodiment of the present invention in which the through opening is partially filled. FIG. 5A illustrates a top view and FIGS. 5B-5D illustrate cross-sectional views of a semiconductor device.

This embodiment illustrates an alternative embodiment of the present invention in which the openings for through vias are partially filled with a conductive material. As illustrated in the magnified cross-sectional view of FIG. 5B, a conductive fill 150 partially fills the through openings and lines the sidewalls of the through openings. The conductive fill 150 may be a conductive liner in one embodiment. Alternatively, the conductive fill 150 may fill and covers the sidewalls of the plurality of openings 80. The plurality of openings 80 remaining after the conductive fill 150 may be filled partially or completely with a dummy fill material 160, which may be an oxide in one embodiment. In some embodiments, as illustrated in FIG. 5C, a void 170 may be left after filling the plurality of openings 80 with the dummy fill material 160. FIG. 5D illustrates a further embodiment including a dielectric liner 155 physically and electrically separating the conductive material in the through via from the substrate 10. The dielectric liner 155 may comprise an oxide or nitride such as silicon oxide or silicon nitride. In other embodiments, the dielectric liner 155 may comprise other dielectrics amenable for depositing within high aspect ratio openings as known to a person having ordinary skill in the art.

Figure 6:
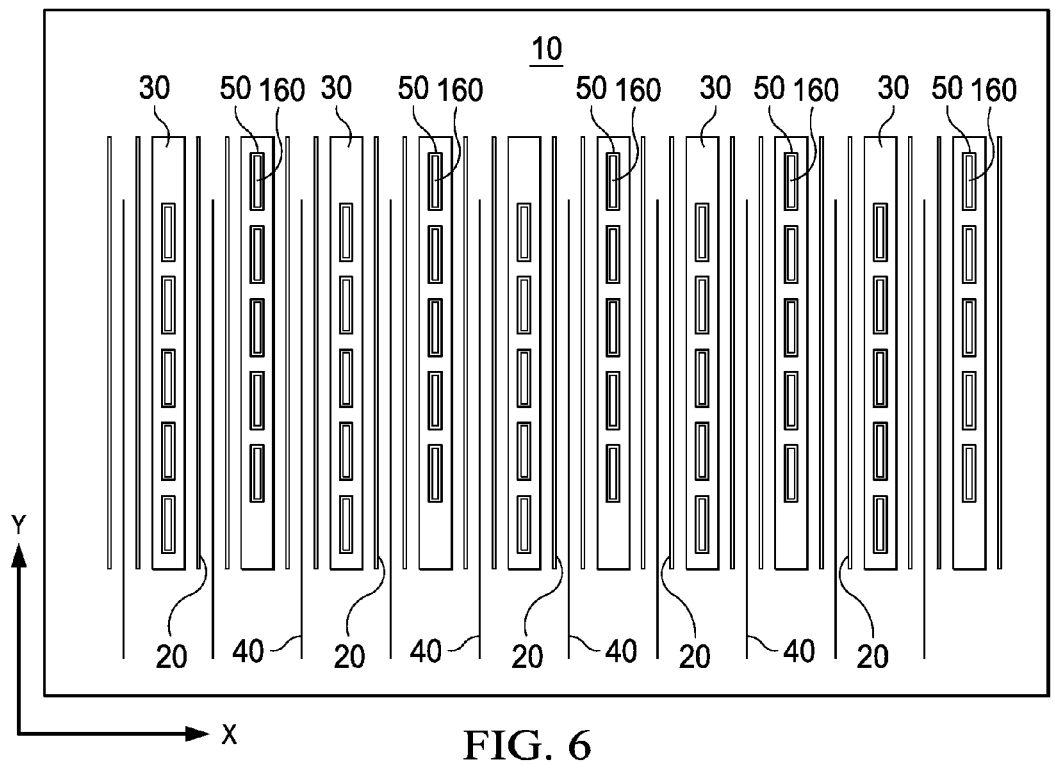
FIG. 6 illustrates an alternative embodiment of a top view of a semiconductor device in which the through vias in adjacent columns are arranged in a pattern.

FIG. 6 illustrates an alternative embodiment of the semiconductor device in which the through vias are arranged in a pattern.

In this embodiment, the through vias 50 in adjacent columns (i.e., adjacent source regions 30) are staggered. The plurality of through vias 50 is arranged in such a layout to maximize the strain decay (or stress field) arising from the through vias 50. In one embodiment, the layout of the plurality of through vias 50 may be used to ensure that a lateral stress (e.g., minimal variation along the y axis of stress oriented in the x-axis ($\sigma_{xx}$)) under the gate lines 20 is uniform. This is because variation in stress can result in variation in carrier mobility, which can result in significant variation in the ON current.

In some embodiments, the layout of the plurality of through vias 50 may cause a compressive strain along the current flow direction (x-axis). Alternatively, in some embodiments, the layout of the plurality of through vias 50 may cause a tensile strain along the current flow direction (x-axis) or a compressive strain along the z-axis under the plurality of gate lines 20. The strain field from the plurality of through vias 50 may be adjusted by the fill materials. For example, in some embodiments, the filled through via illustrated in FIG. 2 may generate a compressive strain while a partial fill as illustrated in FIG. 5C may generate a tensile strain or relieve previously generated strain in the substrate 10. For example, in one embodiment, a partial fill configuration may be used to prevent reliability issues at packaging, e.g., delamination, cracking at solder joint etc.

Figure 7A:
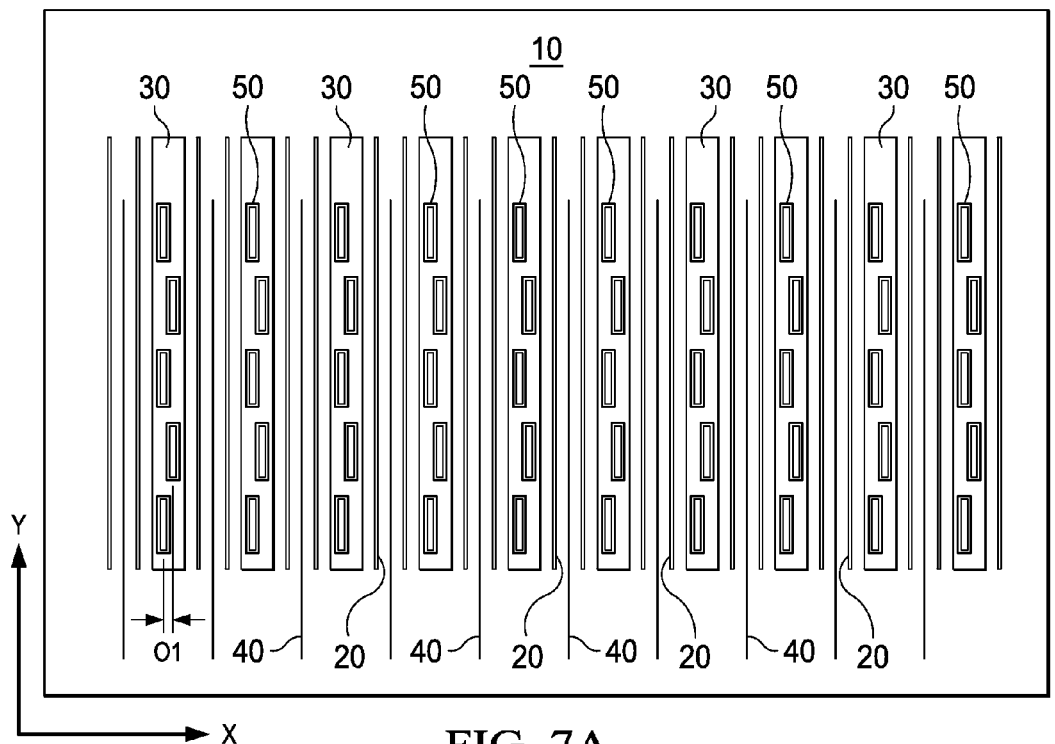
Figure 7B:
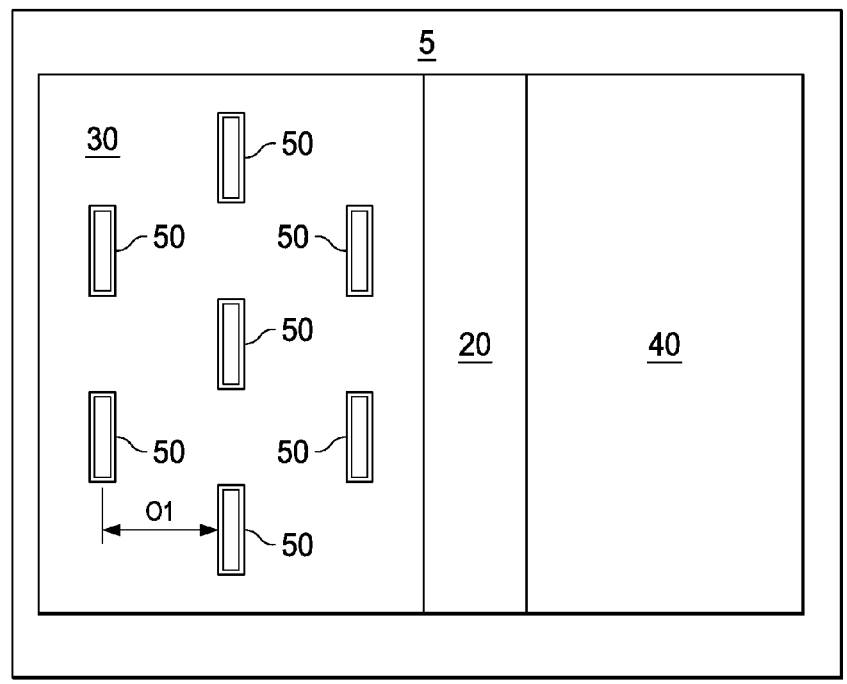
Figure 7C:
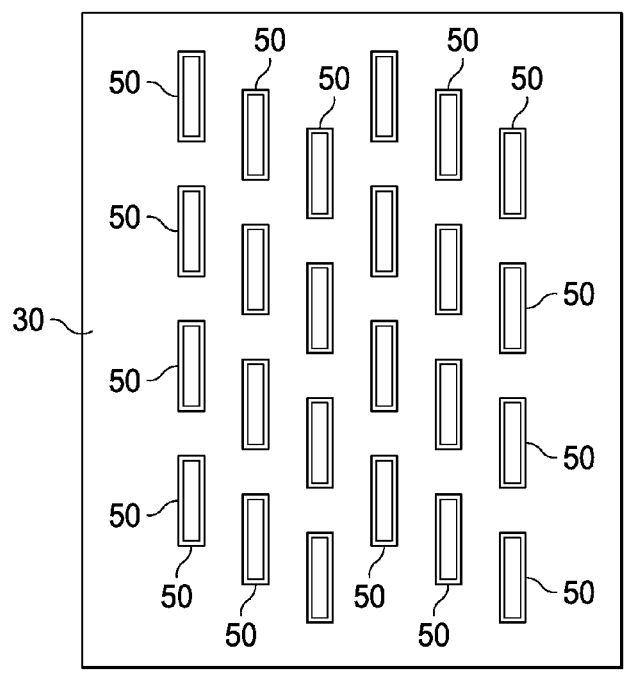

FIG. 7, which includes FIGS. 7A-7C, illustrates an alternative embodiment of a semiconductor device having laterally offset through vias.

In this embodiment, the plurality of through vias 50 within the same source region 30 of a transistor may be laterally offset. For example, the lateral offset may be used to generate a more uniform strain field under the gate lines 20. Alternatively, the lateral offset may be used to reduce the stress concentration at the edges of the plurality of through vias 50 and prevent stress related delamination and other issues.

Referring to FIG. 7A, in one embodiment, alternate through vias of the plurality of through vias 50 may be offset by a first offset distance (O1). The first offset distance (O1) may be about the same as the width of each of the plurality of the through vias 50 measured in a direction along the first offset distance in one embodiment. In alternative embodiments, the first offset distance (O1) may be about the 0.2× to about 10× the width of each of the plurality of through vias 50.

In further embodiments, for example, as illustrated in FIG. 7B, each source region 30 may comprise the plurality of through vias 50 arranged in multiple rows and columns. Further, as illustrated in FIG. 7B, embodiments of the present invention may also be applied to isolated gate structures as illustrated in FIG. 7B. In another alternative embodiment illustrated in FIG. 7C, the arrangement of the plurality of through vias 50 may repeat after a certain number of columns (three columns in the illustration).

Figure 8A:
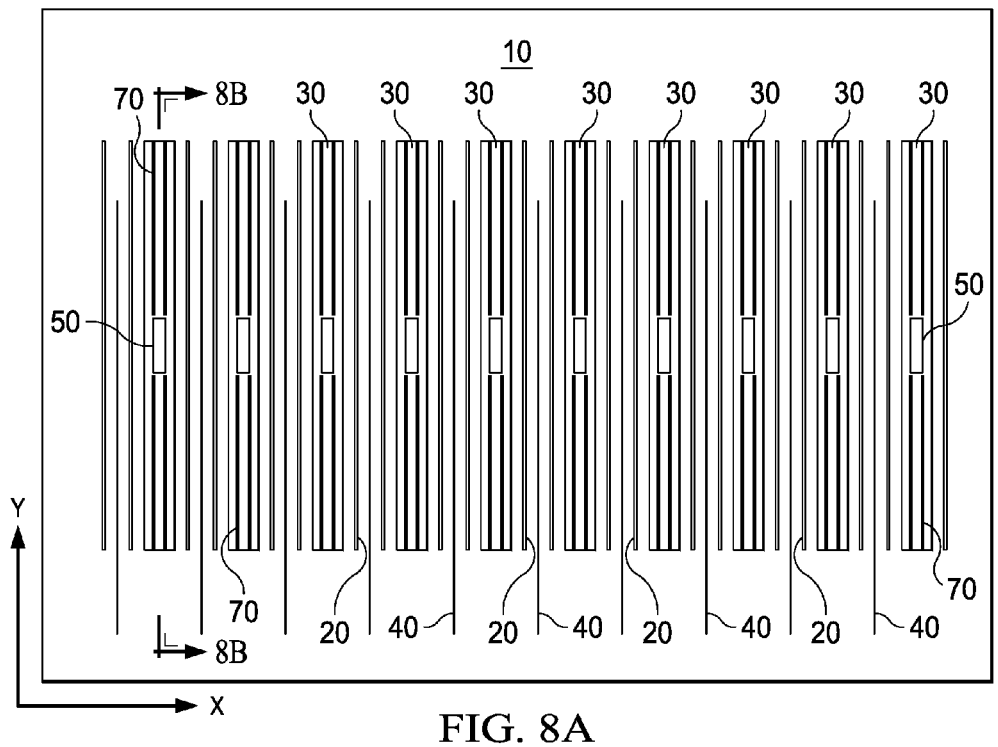
Figure 8B:
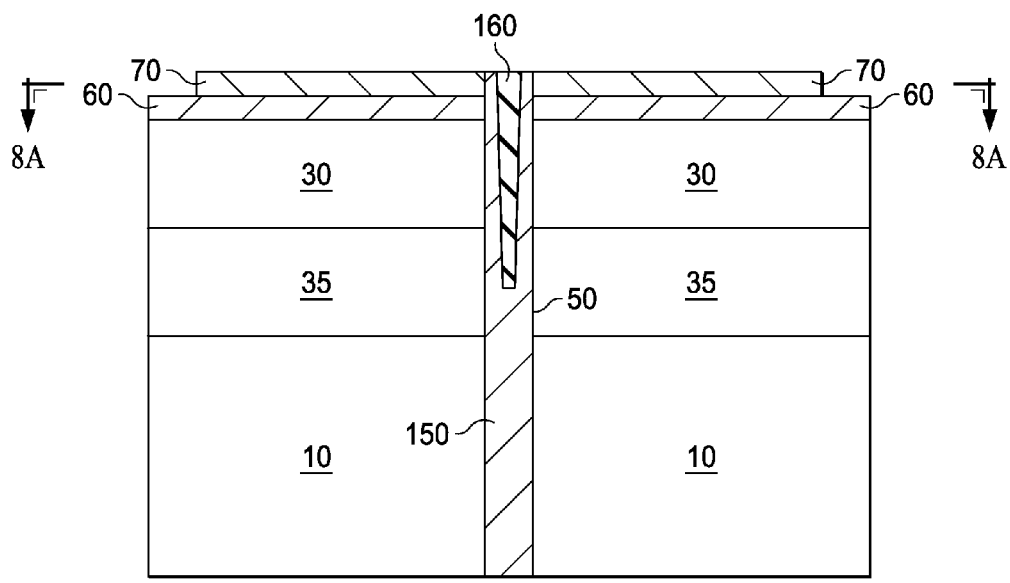

FIG. 8, which includes FIGS. 8A and 8B, illustrates an alternative embodiment of a semiconductor device having a top metallization layer integrated with a through via. FIG. 8A illustrates a top view while FIG. 8B illustrates a cross-sectional view.

In this embodiment, each source region 30 may comprise less number of through vias 50 but the top layer of the through vias 50 extends over the source region and thus increases the contact area between the source region 30 (or the corresponding contact metal) and the through via 50.

As an illustration in FIG. 8A, in one embodiment, each source region 30 has a single through via 50. As illustrated in FIG. 8A, two laterally offset layers of the conductive layer 70 are disposed over each source region 30. In alternative embodiments, each source region 30 may comprise a single conductive layer 70. In various embodiments, the through via 50 extends along the plurality of gate lines 20 so as to cover the periphery of the plurality of gate lines 20. In one or more embodiments, the length of the through via 50 is about 20% more than the corresponding length of a gate line of the plurality of gate lines 20.

Further, as illustrated in FIG. 8B, a conductive layer 70 contacts the conductive fill 150 of the through via and overlaps with the source region 30. In one or more embodiments, the conductive layer 70 may be disposed on the contact layer 60. In some embodiments, the conductive fill 150 and the conductive layer 70 may be formed simultaneously and may therefore comprise a same material layer. FIG. 8B illustrates a through via filled with a conductive fill 150 and a dummy fill material 160 although in other embodiments, the through via 50 may be completely filled with the conductive fill 150.

FIG. 9, which includes FIGS. 9A-9D, illustrates top views of a semiconductor device having a plurality of through vias in accordance with alternative embodiments of the present invention.

FIG. 9 illustrates different possible geometries in fabricating the plurality of through vias in various alternative embodiments. FIGS. 9A-9D illustrate through vias having different aspect ratios. FIG. 9A illustrates a plurality of through vias 50 having an aspect ratio of about 1:1 disposed in a source region of a plurality of source regions 30 of a portion of a finger transistor having a plurality of gate lines 20 and a plurality of drain regions 40.

Figure 9A:
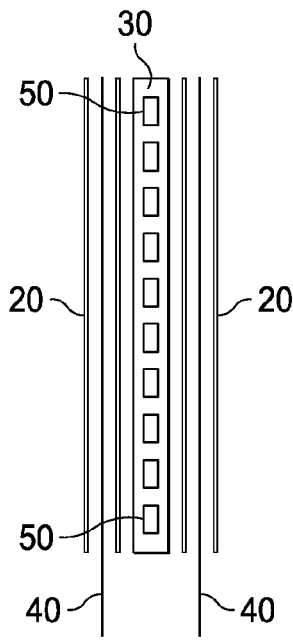
FIGS. 9A-9D, illustrates magnified top views of a semiconductor device having a plurality of through vias of different aspect ratios in accordance with alternative embodiments of the present invention.
Figure 9B:
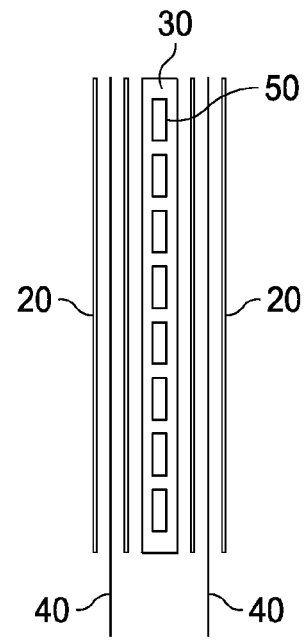
Figure 9C:
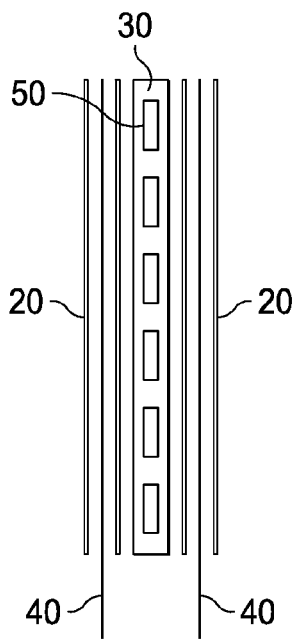
Figure 9D:
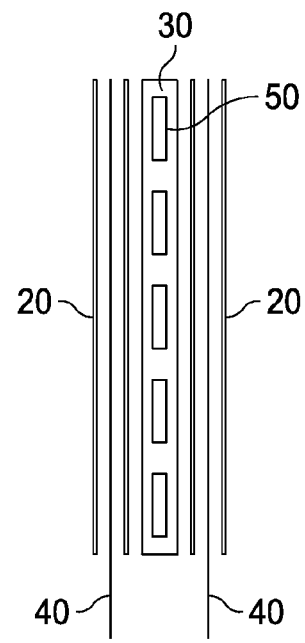

FIG. 9B illustrates a plurality of through vias 50 having an aspect ratio of about 2:1. As illustrated in FIG. 9B, the length of the through via measured along the y-axis is about two times a width of the through via measured along the x-axis, which is the direction of current flow within the transistor. FIG. 9C illustrates an alternative embodiment in which a plurality of through vias 50 have an aspect ratio of about 3:1. As illustrated in FIG. 9C, the length of the through via measured along the y-axis is about three times a width of the through via measured along the x-axis. FIG. 9D illustrates an alternative embodiment in which the aspect ratio of the plurality of through vias 50 is about 4:1. As illustrated in FIG. 9D, the length of the through via measured along the y-axis is about four times a width of the through via measured along the x-axis. In various embodiments, the length of the through via measured along the y-axis is about 1× to about 10× a width of the through via measured along the x-axis.

FIG. 10, which includes FIGS. 10A-10F, illustrates top views of a semiconductor device having a plurality of through vias integrated with a top conductive layer in accordance with alternative embodiments of the present invention.

In further alternative embodiments, the through vias may be coupled to a top conductive layer 70, which may be formed in one or more columns. Referring to FIG. 10A, a plurality of through vias 50 having an aspect ratio of about 1:1 are coupled to a top conductive layer 70. FIG. 10B-10D illustrate further embodiments with alternative aspect ratios, for example, the plurality of through vias 50 may have an aspect ratio of about 2:1 (FIG. 10B), 3:1 (FIG. 10C), 4:1 (FIG. 10D), and other ratios.

Further, as illustrated in FIGS. 10E and 10F, the spacing between adjacent through vias of the plurality of through vias 50 may be varied in various embodiments. In one embodiment, the spacing between adjacent through vias of the plurality of through vias 50 may depend on the technology node, as an example.

Figure 11A:
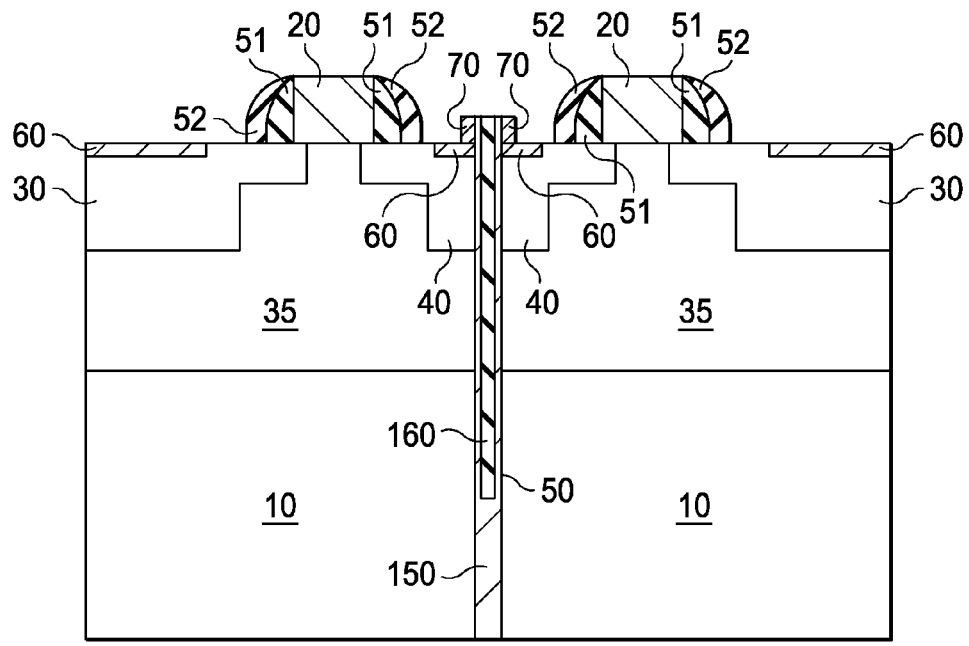
FIGS. 11A and 11B, illustrates a cross-sectional view of a finger transistor having one or more through vias disposed through a drain region of the transistor in accordance with an alternative embodiment of the invention.
Figure 11B:
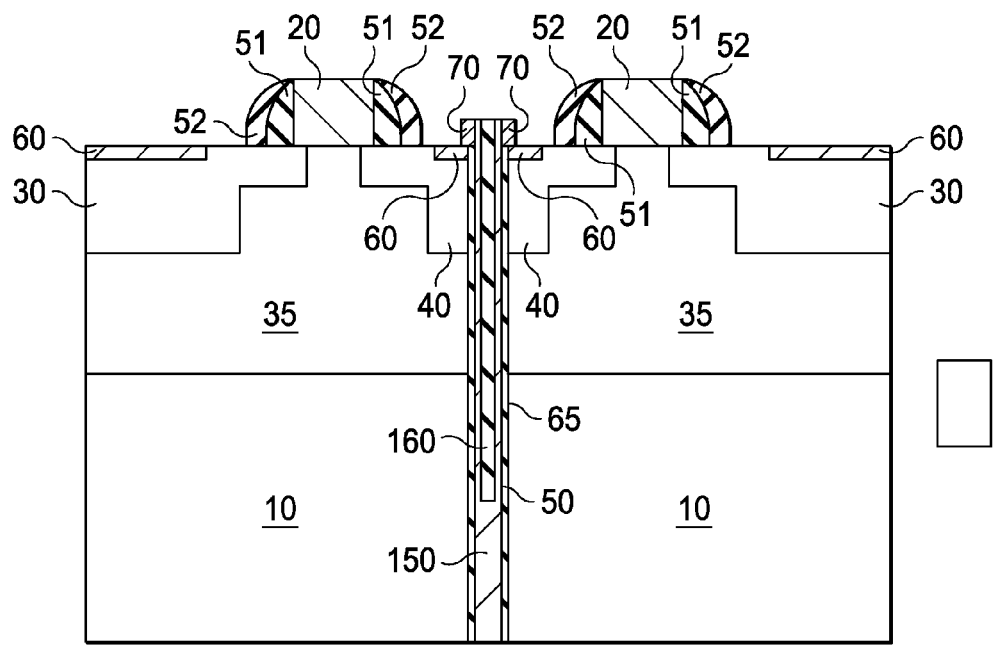

FIG. 11, which includes FIGS. 11A and 11B, illustrates a cross-sectional view of a finger transistor having one or more through vias disposed through a drain region of the transistor or an isolation region in accordance with an alternative embodiment of the invention.

While prior embodiments illustrated a plurality of through vias 50 disposed in the source regions of the transistor, in one or more embodiments, the plurality of through vias 50 may be disposed in other regions of the transistor. For example, FIG. 11A illustrates one embodiment in which a plurality of through vias 50 is disposed in the drain regions 40 of the finger transistor. FIG. 11B illustrates an alternative embodiment in which the through vias include an isolation liner 65.

Figure 12:
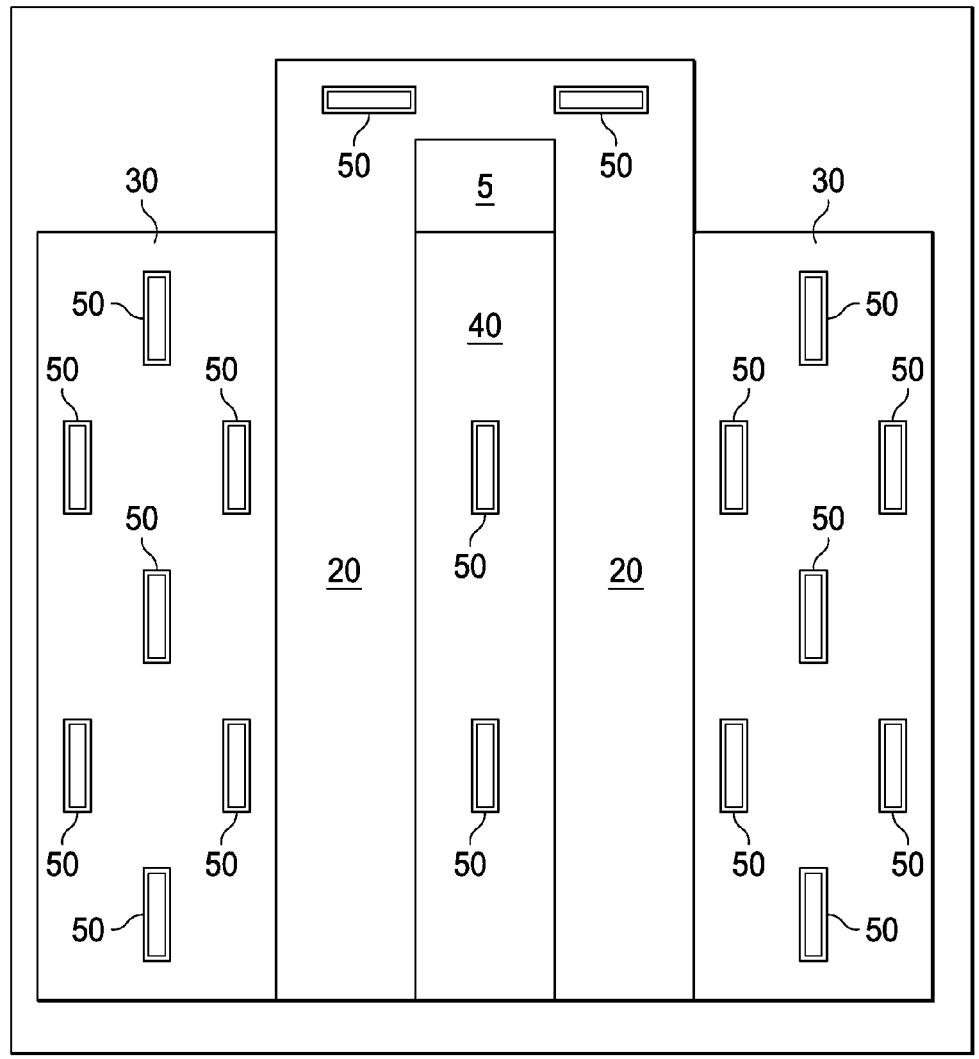
FIG. 12 illustrates a cross-sectional view of a finger transistor having one or more through vias disposed through drain, source, or gate regions in accordance with alternative embodiments of the invention.

FIG. 12 illustrates a cross-sectional view of a finger transistor having one or more through vias disposed through drain, source, or gate regions in accordance with alternative embodiments of the invention.

In various embodiments, the plurality of through vias 50 may be disposed in source, drain, or even gate regions. FIG. 12 illustrates the various possibilities in accordance with such alternative embodiments. The through vias 50 contacting or extending through the gate lines 20 may be disposed in isolation region surrounding the active device. For example, a portion of the gate lines 20 between adjacent gate lines 20 may contact a plurality of through vias 50.

Figure 13A:
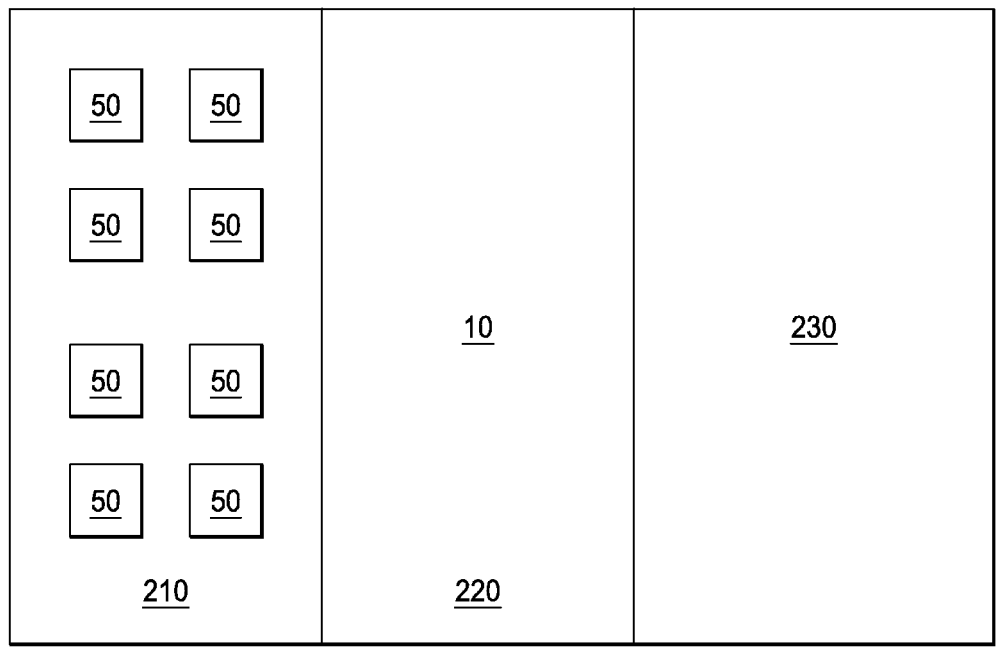
FIGS. 13A and 13B, illustrates alternative embodiments of top views of a semiconductor device comprising a bipolar junction device comprising a plurality of through vias.
Figure 13B:
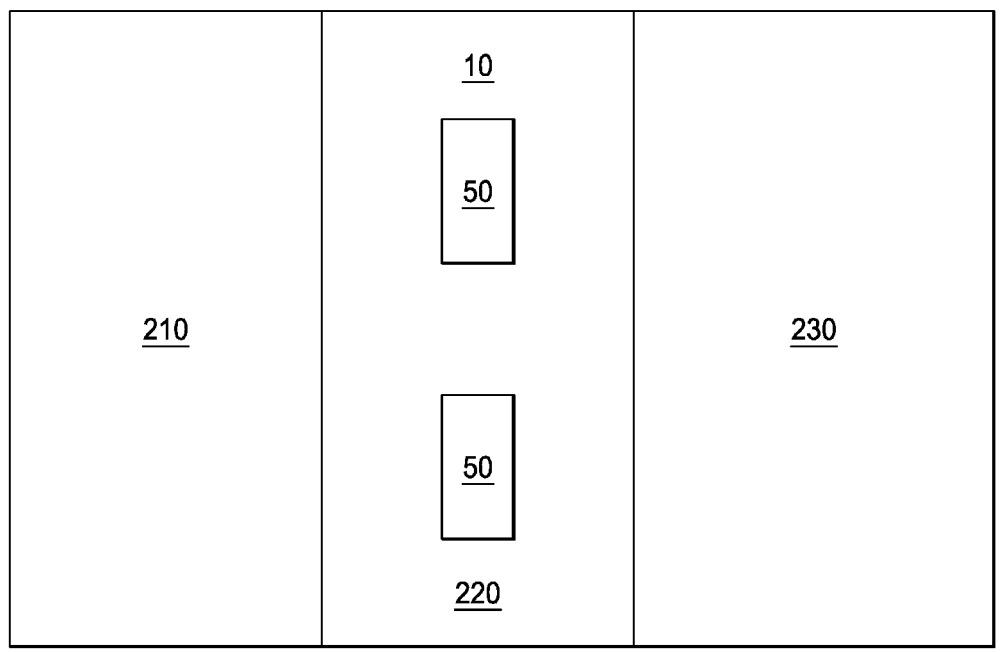

FIG. 13, which includes FIGS. 13 and 13B, illustrates alternative embodiments of top views of a semiconductor device comprising a bipolar junction device comprising a plurality of through vias.

Referring to FIG. 13, a bipolar junction device comprises a first emitter/collector region 210, a base region 220, and a second emitter/collector region 230. The bipolar junction device may be a NPN transistor in one embodiment. In another embodiment, the bipolar junction device may be a PNP transistor.

Referring to FIG. 13A, in one embodiment, the first emitter/collector region 210 may include a plurality of through vias 50. The first emitter/collector region 210 may be a emitter or a collector in various embodiments. FIG. 13B illustrates an alternative embodiment showing a plurality of through vias 50 disposed through a base region 220 of a bipolar junction transistor.

Figure 14:
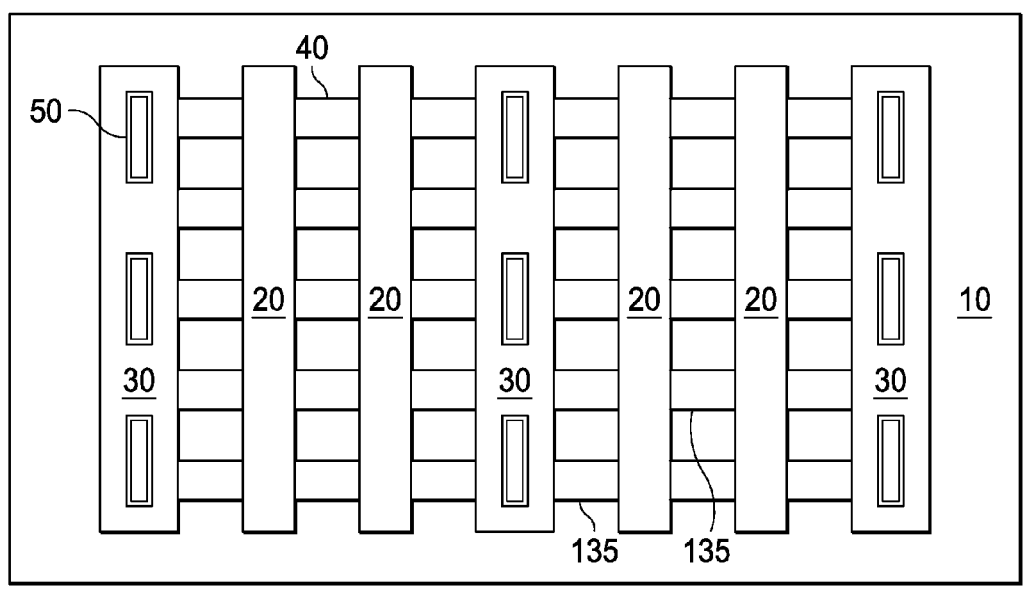
FIG. 14 illustrates an alternative embodiment of a top view of a semiconductor device comprising a multi-gate transistor having through vias.

FIG. 14 illustrates an alternative embodiment of a top view of a semiconductor device comprising a multi-gate transistor having through vias.

Referring to FIG. 14, in or more embodiments, a plurality of fins 135 form part of a multiple gate field effect transistor or a fin field effect transistor. The plurality of fins 135 may be coupled at common source regions 30, which may be epitaxial regions, for example, raised source/drain regions. A plurality of through vias 50 may be formed at each of the source regions 30 in one or more embodiments.

FIG. 15, which includes FIGS. 15A-15H, illustrates different shapes of the through vias in accordance with embodiments of the present invention.

Figure 15A:
FIGS. 15A-15H, illustrates different shapes of the through vias in accordance with embodiments of the present invention.
Figure 15B:
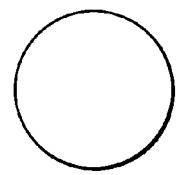
Figure 15C:
Figure 15D:
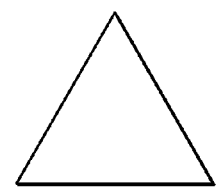
Figure 15E:
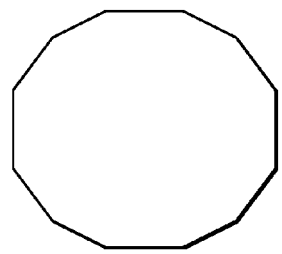
Figure 15F:
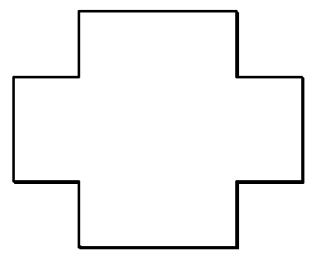
Figure 15G:
Figure 15H:
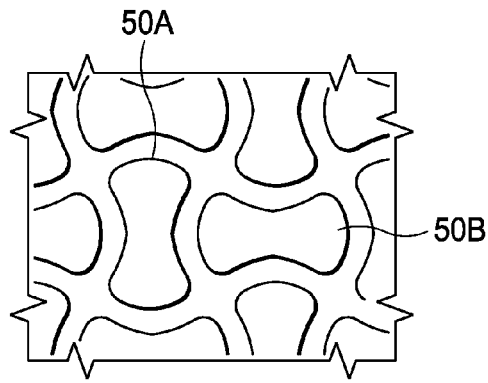

In various embodiments, each of the through via may be configured to have any suitable shape. FIG. 15A illustrates a rectangular via in one embodiment. In accordance with various alternative embodiments, FIG. 15B illustrates a circular through via, FIG. 15C illustrates a oval shaped through via, FIG. 15D illustrates a triangular shaped through via, FIG. 15E illustrates a multi-sided through via. FIG. 15F illustrates a plaque shaped through via in another alternative embodiment. FIG. 15G illustrates a bone shaped through via in another alternative embodiment. FIG. 15H illustrates a combination of bone shaped through vias in accordance with another alternative embodiment. In this embodiment, the arrangement of the bone shaped regions may be aligned to minimize the stress concentration around the through via. In other words, the stress from the through vias may be homogenized by using an interweaving bone shaped through via array. As illustrated, a first array of bone shaped through vias 50A is arranged along a first direction while a second array of bone shaped through vias 50B is arranged along a second direction perpendicular to the first array of bone shaped through vias 50A. The minimum of the overall stress/strain field of pattern in FIG. 15H may be achieved by applying a partial fill to the conductive layer 70.

The term "source" and "drain" is used only for identification and may be interchangeable in various embodiments. For example, in one or more embodiments, the source may be a source for electrons (negative current) or holes (positive current).

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-15 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
   a device region disposed in or over a semiconductor substrate, the semiconductor substrate comprising a first major outer surface and a second major outer surface;
   a first doped region disposed in the device region;
   a well region disposed in the semiconductor substrate and extending below the first doped region, the well region having an opposite doping to the first doped region;
   a gate structure disposed over the semiconductor substrate, the gate structure comprising a first gate line, a second gate line, and a connecting line perpendicular to the first gate line, wherein the connecting line is directly above a isolation region disposed in the semiconductor substrate; and
   a first through substrate via disposed through the connecting line, wherein the first through substrate via extends completely through the connecting line into the semiconductor substrate from the first major outer surface to the second major outer surface, wherein the first through substrate via extends completely through the semiconductor substrate from the first major outer surface to the second major outer surface, wherein the first through substrate via electrically couples the gate structure to a first contact area at the second major outer surface.

2. The chip of claim 1, wherein the device region comprises a field effect transistor and wherein the first doped region is a source/drain region of the field effect transistor.

3. The chip of claim 2, wherein the field effect transistor comprises a fin field effect transistor.

4. The chip of claim 1, wherein the device region comprises a bipolar junction transistor and wherein the first doped region is an emitter/collector region of the bipolar junction transistor.

5. The chip of claim 1, wherein the device region comprises a bipolar junction transistor and wherein the first doped region is a base region of the bipolar junction transistor.

6. The chip of claim 1, further comprising:
   a plurality of through substrate vias disposed in the semiconductor substrate proximate the first through substrate via, the plurality of through substrate vias extending through the first doped region.

7. The chip of claim 1, wherein the first doped region is part of a finger transistor.

8. The chip of claim 1, wherein the first through substrate via is partially filled with a conductive material.

9. The chip of claim 1, wherein the first through substrate via is lined with a conductive material, and wherein a portion of the first through via is filled with an insulating material.

10. The device of claim 1, further comprising a plurality of fins disposed in the semiconductor substrate, wherein the first doped region is disposed over and electrically coupled to the plurality of fins.

11. The chip of claim 1, further comprising a metallization layer disposed over the first major outer surface at the front side of the semiconductor chip, wherein the second major outer surface is the back side of the semiconductor chip.

12. The chip of claim 1, further comprising a second through substrate via disposed in the semiconductor substrate and extending through the first doped region and the well region, wherein the second through substrate via extends completely through the semiconductor substrate from the first major outer surface to the second major outer surface, wherein the second through substrate via completely extends through the entire thickness of the semiconductor substrate, and wherein the second through substrate via electrically couples the first doped region to the second major outer surface.

13. The chip of claim 12, further comprising:
   a third through substrate via disposed proximate the second through substrate via in the first doped region.

14. The chip of claim 12, further comprising:
   a first plurality of through substrate vias disposed in the semiconductor substrate proximate the second through substrate via, the first plurality of through substrate vias extending through the first doped region; and
   a second plurality of through substrate vias disposed in the semiconductor substrate proximate the second through substrate via, the second plurality of through substrate vias extending through the first doped region, wherein the first plurality of through substrate vias are oriented along a first line.

15. The chip of claim 14, wherein the second plurality of through substrate vias are oriented along a second line, and wherein the first line is offset relative to the second line.

16. The chip of claim 12, further comprising a contact layer disposed in the semiconductor substrate, the second through substrate via extending through the contact layer.

17. The chip of claim 16, further comprising:
   a dielectric layer disposed over the semiconductor substrate; and
   a contact plug disposed through the dielectric layer, the contact plug contacting the contact layer.

18. The chip of claim 12, further comprising a conductive layer disposed over the semiconductor substrate, the second through substrate via extending through the conductive layer.

19. The device of claim 12, wherein the first doped region is a common region shared by a first source/drain region and a second source/drain region, and wherein the second through substrate via is disposed in the common region.

20. The chip of claim 12, further comprising an insulating liner around the second through substrate via, wherein the insulating liner insulates a conductive fill material of the second through substrate via from the first doped region, the device region, and semiconductive material of the semiconductor substrate.

21. A semiconductor device comprising:
 a first doped region disposed in an active region of a semiconductor substrate, the semiconductor substrate comprising a first major outer surface and a second major outer surface;
 a well region disposed in the semiconductor substrate and extending under the first doped region, the well region having an opposite doping to the first doped region;
 a first plurality of through substrate vias disposed in the semiconductor substrate, the first plurality of through substrate vias extending through the first doped region and the well region;
 a second doped region disposed in the active region, the well region extending under the second doped region, wherein the second doped region is a different region from the first doped region and is spaced apart from the first doped region by a region of the active region;
 a second plurality of through substrate vias disposed in the semiconductor substrate, the second plurality of through substrate vias extending through the second doped region and the well region, wherein the first plurality of through substrate vias and the second plurality of through substrate vias extend through the semiconductor substrate from the first major outer surface to the second major outer surface, wherein the first plurality of through substrate vias completely extends through the entire thickness of the semiconductor substrate, wherein the first plurality of through substrate vias electrically couples the first doped region to a first contact area on the second major outer surface, wherein the second plurality of through substrate vias completely extends through the entire thickness of the semiconductor substrate, and wherein the second plurality of through substrate vias electrically couples the second doped region to a second contact area on the second major outer surface;
 a metallization layer disposed over the first major outer surface, wherein the second major outer surface is the back side of the semiconductor device;
 a gate structure disposed over the semiconductor substrate, the gate structure comprising a first gate line, a second gate line, and a connecting line perpendicular to the first gate line, wherein the connecting line is directly above a isolation region disposed in the semiconductor substrate; and
 a first through substrate via disposed through the connecting line, wherein the first through substrate via extends completely through the connecting line into the semiconductor substrate from the first major outer surface to the second major outer surface, wherein the first through substrate via extends completely through the semiconductor substrate from the first major outer surface to the second major outer surface, wherein the first through substrate via electrically couples the gate structure to a first contact area at the second major outer surface.

22. The device of claim 21, further comprising:
 a third plurality of through substrate vias disposed in the semiconductor substrate, the third plurality of through substrate vias extending through the first doped region, wherein the first plurality of through substrate vias are oriented along a first line, and the third plurality of through substrate vias are oriented along a second line parallel to the first line.

23. The device of claim 22, wherein the first plurality of through substrate vias is staggered relative to the second plurality of through substrate vias.

24. A semiconductor device comprising:
 a well region disposed in a semiconductor substrate;
 a first transistor disposed in the well region of the semiconductor substrate, the first transistor comprising a first source/drain, the semiconductor substrate comprising a first major outer surface and a second major outer surface;
 a second transistor disposed in the well region of the semiconductor substrate and comprising a second source/drain, wherein the first source/drain and the second source/drain share a common region; and
 a first through substrate via disposed in the common region, wherein the first through substrate via extends completely through the semiconductor substrate from the first major outer surface to the second major outer surface, wherein the first through substrate via completely extends through the entire thickness of the semiconductor substrate, and wherein the first through substrate via electrically couples the common region to the second major outer surface;
 a metallization layer disposed over the first major outer surface of the semiconductor device, wherein the second major outer surface is the back side of the semiconductor device;
 a gate structure disposed over the semiconductor substrate, the gate structure comprising a first gate line, a second gate line, and a connecting line perpendicular to the first gate line, wherein the connecting line is directly above a isolation region disposed in the semiconductor substrate; and
 a first through substrate via disposed through the connecting line, wherein the first through substrate via extends completely through the connecting line into the semiconductor substrate from the first major outer surface to the second major outer surface, wherein the first through substrate via extends completely through the semiconductor substrate from the first major outer surface to the second major outer surface, wherein the first through substrate via electrically couples the gate structure to a first contact area at the second major outer surface.

25. The device of claim 24, further comprising a plurality of through substrate vias disposed in the common region, the plurality of through substrate vias extending completely through the semiconductor substrate, wherein the plurality of through substrate vias completely extend through the entire thickness of the semiconductor substrate, and wherein the plurality of through substrate vias electrically couple the common region to the second major outer surface.

26. The device of claim 24, further comprising a contact layer disposed in the semiconductor substrate, the first through substrate via extending through the contact layer.

27. The device of claim 26, further comprising a conductive layer disposed over the semiconductor substrate, the first through substrate via extending through the conductive layer.

28. The device of claim 24, wherein the first transistor and the second transistor are part of a finger transistor.

29. The device of claim 24, wherein the first through substrate via extends through the first source/drain.

30. The device of claim 24, further comprising:
a first plurality of through substrate vias disposed in the semiconductor substrate proximate the first through substrate via, the first plurality of through substrate vias extending through the common region; and
a second plurality of through substrate vias disposed in the semiconductor substrate proximate the first through substrate via, the second plurality of through substrate vias extending through the common region, wherein the first plurality of through substrate vias are oriented along a first line, wherein the second plurality of through substrate vias are oriented along a second line, and wherein the first line is offset relative to the second line.

31. The device of claim 24, wherein the first through substrate via is lined with a conductive material, and wherein a portion of the first through substrate via is filled with an insulating material.

32. A method of forming a semiconductor chip, the method comprising:
forming a well region in a semiconductor substrate, the semiconductor substrate comprising a first major outer surface and a second major outer surface;
forming a device region in or over the semiconductor substrate;
forming a first doped region in the device region, the first doped region being formed within the well region;
forming a gate structure over the semiconductor substrate, the gate structure comprising a first gate line, a second gate line, and a connecting line perpendicular to the first gate line, wherein the connecting line is directly above a isolation region disposed in the semiconductor substrate;
forming a first through substrate via through the connecting line, wherein the first through substrate via extends completely through the connecting line into the semiconductor substrate from the first major outer surface to the second major outer surface, wherein the first through substrate via extends completely through the semiconductor substrate from the first major outer surface to the second major outer surface, wherein the first through substrate via electrically couples the gate structure to a first contact area at the second major outer surface; and
forming a metallization layer over the first major outer surface of the semiconductor chip, wherein the second major outer surface is the back side of the semiconductor chip.

33. The method of claim 32, wherein a plurality of through substrate vias are formed in the semiconductor substrate simultaneously.

34. The method of claim 33, wherein the plurality of through substrate vias are formed extending through the first doped region.

35. The method of claim 32, further comprising forming a second through substrate via in the semiconductor substrate, the second through substrate via extending through the first doped region and the well region, wherein the second through substrate via extends completely through the semiconductor substrate from the first major outer surface to the second major outer surface, wherein the second through via completely extends through the entire thickness of the semiconductor substrate, and wherein the second through via electrically couples the first doped region to the second major outer surface.

36. The method of claim 35, further comprising:
forming a first plurality of through substrate vias in the semiconductor substrate proximate the second through substrate via, the first plurality of through substrate vias extending through the first doped region; and
forming a second plurality of through substrate vias in the semiconductor substrate proximate the second through substrate via, the second plurality of through substrate vias extending through the first doped region, wherein the first plurality of through substrate vias are oriented along a first line, wherein the second plurality of through substrate vias are oriented along a second line, and wherein the first line is offset relative to the second line.

37. The method of claim 35, wherein the second through substrate via is lined with a conductive material, and wherein a portion of the second through substrate via is filled with an insulating material.

38. A device comprising:
a well region disposed in a semiconductor substrate;
a first transistor disposed in the well region of the semiconductor substrate, the first transistor comprising a first source/drain and a second source/drain, the semiconductor substrate comprising a first major outer surface and a second major outer surface;
a gate structure disposed over the semiconductor substrate, the gate structure comprising a first gate line, a second gate line, and a connecting line perpendicular to the first gate line, wherein the connecting line is directly above a isolation region disposed in the semiconductor substrate;
a first through substrate via disposed through the connecting line, wherein the first through substrate via extends completely through the connecting line into the semiconductor substrate from the first major outer surface to the second major outer surface, wherein the first through substrate via extends completely through the semiconductor substrate from the first major outer surface to the second major outer surface, wherein the first through substrate via electrically couples the gate structure to a first contact area at the second major outer surface; and
a first plurality of through substrate vias disposed in the first source/drain and extending completely through the first source/drain and the well region, wherein the first plurality of through substrate vias extend completely through the semiconductor substrate from the first major outer surface to the second major outer surface, and wherein the first plurality of through substrate vias electrically couple the first source/drain to a second contact area at the second major outer surface.

39. The device of claim 38, further comprising:
a second transistor disposed in the semiconductor substrate and comprising a third source/drain and a fourth source/drain, wherein the second source/drain and the fourth source/drain share a common region.

40. The device of claim 39, further comprising:
a second plurality of through substrate vias disposed in the common region, wherein the second plurality of through substrate vias extend completely through the semiconductor substrate from the first major outer surface to the second major outer surface, wherein the second plurality of through substrate vias completely extend through the entire thickness of the semiconductor substrate, and wherein the second plurality of through substrate vias electrically couples the common region to a third contact area at the second major outer surface.

41. The device of claim 39, further comprising:
a second plurality of through substrate vias disposed in the third source/drain, wherein the second plurality of through substrate vias extend completely through the semiconductor substrate from the first major outer surface to the second major outer surface, and wherein the second plurality of through substrate vias electrically couple the third source/drain to a third contact area at the second major outer surface.

42. The device of claim 38, wherein the device region comprises a field effect transistor, a fin field effect transistor, or a bipolar junction transistor.

\* \* \* \* \*